United States Patent [19]
Rokni et al.

[11] Patent Number: 5,978,406
[45] Date of Patent: Nov. 2, 1999

[54] FLUORINE CONTROL SYSTEM FOR EXCIMER LASERS

[75] Inventors: Shahryar Rokni; Tom A. Watson, both of Carlsbad; David J. Tammadge, San Diego, all of Calif.

[73] Assignee: Cymer, Inc., San Diego, Calif.

[21] Appl. No.: 09/016,525

[22] Filed: Jan. 30, 1998

[51] Int. Cl.⁶ .................................................. H01S 3/225
[52] U.S. Cl. ................................. 372/58; 372/57; 372/59
[58] Field of Search .......................................... 372/55–60

[56] References Cited

U.S. PATENT DOCUMENTS

| | | | |
|---|---|---|---|
| 4,674,099 | 6/1987 | Turner | 372/59 |
| 4,722,090 | 1/1988 | Haruta et al. | 372/57 |
| 4,977,749 | 12/1990 | Sercel | 62/51.1 |
| 5,005,180 | 4/1991 | Edelman et al. | 372/57 |
| 5,005,181 | 4/1991 | Yoshioka et al. | 372/59 |
| 5,017,499 | 5/1991 | Hakuta et al. | 436/124 |
| 5,090,020 | 2/1992 | Bedwell | 372/59 |
| 5,149,659 | 9/1992 | Hakuta et al. | 372/59 X |
| 5,199,267 | 4/1993 | Mitsui | 62/51.1 |
| 5,377,215 | 12/1994 | Das et al. | 372/57 |
| 5,440,578 | 8/1995 | Sandstrom | 372/59 |

*Primary Examiner*—John D. Lee
*Attorney, Agent, or Firm*—John R. Ross, Esq.

[57] ABSTRACT

An excimer laser with a laser gas containing fluorine in which the fluorine concentration is maintained continuously at or substantially at desired predetermined levels. A real time or substantially real time fluorine monitor provides a feedback signal to a fluorine flow control system which provides continuous fluorine injection flow into the laser chamber to precisely compensate for fluorine depletion and maintain fluorine concentration precisely at desired levels. In a preferred embodiment, fluorine detector which may be a chemical detector periodically measures the fluorine concentration in laser gas discharged from the laser in order to calibrate the real time or substantially real time fluorine monitor. In a second preferred embodiment, the continuous inlet flow is from two gas sources, one containing fluorine, a noble gas and a buffer gas and the other containing only the noble gas and the buffer gas. In a third embodiment, the continuous inlet flow is from a gas source containing fluorine, a noble gas and a buffer gas and filtered gas discharged from the laser.

16 Claims, 4 Drawing Sheets

FLUORINE CONTROL SYSTEM FOR EXCIMER LASERS

This invention relates to excimer lasers and in particular for equipment and methods for controlling laser gas in excimer lasers.

BACKGROUND OF THE INVENTION

Excimer lasers are well known. An important use of excimer lasers is to provide the light source for integrated circuit lithography. The type of excimer laser currently being supplied in substantial numbers for integrated circuit lithography is the KrF laser which produces ultraviolet light at a wavelength of 248 nm. A similar excimer laser, the ArF laser, provides ultraviolet light at 193 nm. These lasers typically operate in a pulse mode at pulse rates such as 1,000 Hz. The laser beam is produced in a laser chamber containing a gain medium created by the discharge through a laser gas between two elongated electrodes of about 28 inches in length and separated by about ⅝ inch. The discharge is produced by imposing a high voltage such as about 20,000 volts across the electrodes. For the KrF laser, the laser gas is typically about 1% krypton, 0.1% fluorine and about 99% neon. For the ArF laser the gas is typically about 3 to 4% argon, 0.1% fluorine and 96 to 97% neon. In both cases in order to achieve high pulse rates of about 1,000 Hz, the gas must be circulated between the electrodes at speeds of about 500 to 1,000 inches per second.

Fluorine is the most reactive element known and it becomes even more reactive when ionized during the electric discharge. Special care must be exercised to utilize in these laser chambers materials such as nickel coated aluminum which are reasonably compatible with fluorine. Further, laser chambers are pretreated with fluorine to create passification layers on the inside of the laser chamber walls. However, even with this special care, fluorine will react with the walls and other laser components which results in a relatively regular depletion of the fluorine. The rates of depletion are dependent on many factors, but for a given laser at a particular time in its useful life, the rates of depletion depend primarily on the pulse rate and load factor if the laser is operating. If the laser is not operating, the depletion rate is substantially reduced. The rate of depletion is further reduced if the gas is not being circulated. To make up for this depletion, new fluorine is typically injected at intervals of about 1 to 3 hours. Rather than inject pure fluorine it is a typical practice to inject a mixture of 1% fluorine, 1% krypton and 98% neon. For example, in a typical 1000 Hz KrF excimer laser used for lithography, the quantity of its fluorine, krypton, neon mixture injected to compensate for the fluorine depletion varies from about 60 scc per hour when the laser is not operating and the laser gas is not being circulated to about 600 scc per hour when the laser is running continuously at 1000 Hz. The typical injection rate is about 120 scc per hour when the chamber fan is circulating the laser gas, but the laser is not firing. A typical operating mode of about 300 pulse bursts separated by a "dead time" of 0.2 second will produce an average injection rate of about 180 scc per hour.

The unit "scc" refers to "standard cubic centimeters". Other commonly used units for describing quantities of fluorine in a particular volume are percent (%) fluorine, parts per million and kilo Pascals, the latter term sometimes refers to the partial pressure of the fluorine gas mixture and sometimes to the partial pressure of fluorine alone. A 180 scc per hour injection rate of the 1% fluorine mixture would correspond to a depletion decrease in the fluorine concentration over 2 hours from about 0.11 percent to about 0.09 percent and to a decrease in the partial pressure of the fluorine neon gas mixture from about 28 kPa to about 24 kPa. The actual quantity of fluorine depleted in two hours as measured in grams of pure fluorine would be about 6.1 milligrams during the two hour period corresponding to the above 180 scc/hour injection rate (i.e., 360 scc of the 1% fluorine mixture injected during the two-hour interval) of the fluorine gas mixture.

For integrated circuit lithography a typical mode of operation requires laser pulses of constant pulse energy such as 0.010 J/pulse at about 1000 Hz which are applied to a waffer in bursts such as about 300 pulses (with a duration of about 300 milliseconds) with a dead time of a fraction of a second to a few seconds between bursts. Their mode of operation may be continuous 24 hours per day, seven days per week for several months, with scheduled down time for maintenance and repairs of, for example, 8 hours once per week or once every two weeks. Therefore, these lasers must be very reliable and substantially trouble-free.

In typical KrF and ArF excimer lasers used for lithography, high quality reproducible pulses with desired pulse energies of about 0.01 J/pulse may be obtained over a substantial range of fluorine concentration from about 0.08 percent (800 parts/million or about 24 kPa) to about 0.12 percent (1,200 parts/million). Over the normal laser operating range the discharge voltage required to produce the desired pulse energy increases as the fluorine concentration decreases (assuming other laser parameters remain approximately constant). FIG. 1 shows the typical relationship between discharge voltage and fluorine concentration for constant pulse energy of 0.014J and 0.010J.

Prior art techniques typically utilize the relationship between discharge voltage and fluorine concentration to maintain constant pulse energy despite the continuous depletion of fluorine. The discharge voltage of prior art excimer lasers can be changed very quickly and accurately and can be controlled with electronic feedback controls set to monitor pulse energy and maintain it constant. Accurate precise control of fluorine concentration in the past has proven difficult. Therefore, in typical prior art KrF and ArF laser systems, the fluorine concentration is allowed to decrease for periods of about 1 to 4 or 5 hours while the discharge voltage is adjusted by a feedback control system to maintain constant pulse energy output. Periodically at intervals of about 1 to a few hours, fluorine is injected during short injection periods of a few seconds to a few minutes. Thus, in normal operations fluorine concentration gradually decreases from (for example) about 0.11 percent to about 0.09 percent over a period of about 1 to a few hours while the discharge voltage is increased over the same period from for example about 600 volts to about 640 volts. The injection of fluorine at the end of the 1 to a few hour period (when the voltage has drifted up to about 640 volts) brings the fluorine concentration back to about 0.11 percent and the feedback control automatically reduces the voltage back to 600 volts. This basic process is typically repeated for several days. Since contamination gradually builds up in the laser gas over a period of several days, it is usually desirable to replace substantially all of the gas in the laser with new laser gas at intervals of about 5–10 days. FIG. 2 described the prior art fluorine injection technique discussed above.

The above-described prior art technique is effectively used today to provide long term reliable operation of these excimer lasers in a manufacturing environment. However, several laser parameters, such as bandwidth, beam profile and wavelength, are adversely affected by the substantial swings in the discharge voltage and fluorine concentration.

A substantial number of techniques have been proposed and patented for measuring and controlling the fluorine concentration in excimer lasers to within more narrow limits than those provided under the above described prior art technique. These techniques have generally not been commercially pursued.

What is needed is a better system and method for dealing with the issue of fluorine depletion in KrF and ArF excimer lasers.

SUMMARY OF THE INVENTION

The present invention provides an excimer laser with a laser gas containing fluorine in which the fluorine concentration is maintained continuously at or substantially at desired predetermined levels. A real time or substantially real time fluorine monitor provides a feedback signal to a fluorine flow control system which provides continuous fluorine injection flow into the laser chamber to precisely compensate for fluorine depletion and maintain fluorine concentration precisely at desired levels. In a preferred embodiment, fluorine detector which may be a chemical detector periodically measures the fluorine concentration in laser gas discharged from the laser in order to calibrate the real time or substantially real time fluorine monitor. In a second preferred embodiment, the continuous inlet flow is from two gas sources, one containing fluorine, a noble gas and a buffer gas and the other containing only the noble gas and the buffer gas. In a third embodiment, the continuous inlet flow is from a gas source containing fluorine, a noble gas and a buffer gas and filtered gas discharged from the laser.

DETAILED DESCRIPTION OF PREFERRED EMBODIMENTS

Preferred embodiments of the present invention can be described by reference to the figures.

First Preferred Embodiment

Figure 1:
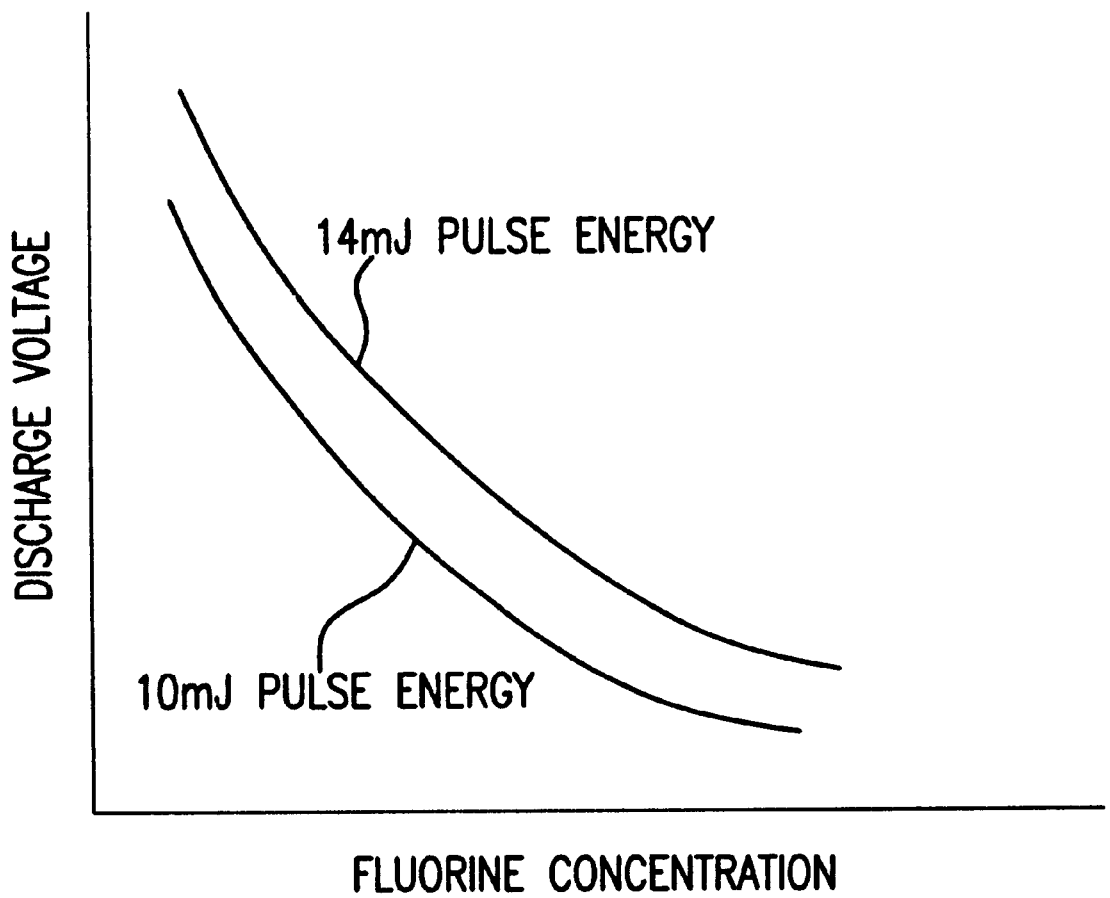
FIG. 1 is a graph showing the typical relationship between discharge voltage and fluorine concentration in a typical commercial KrF or ArF excimer laser.
Figure 2:
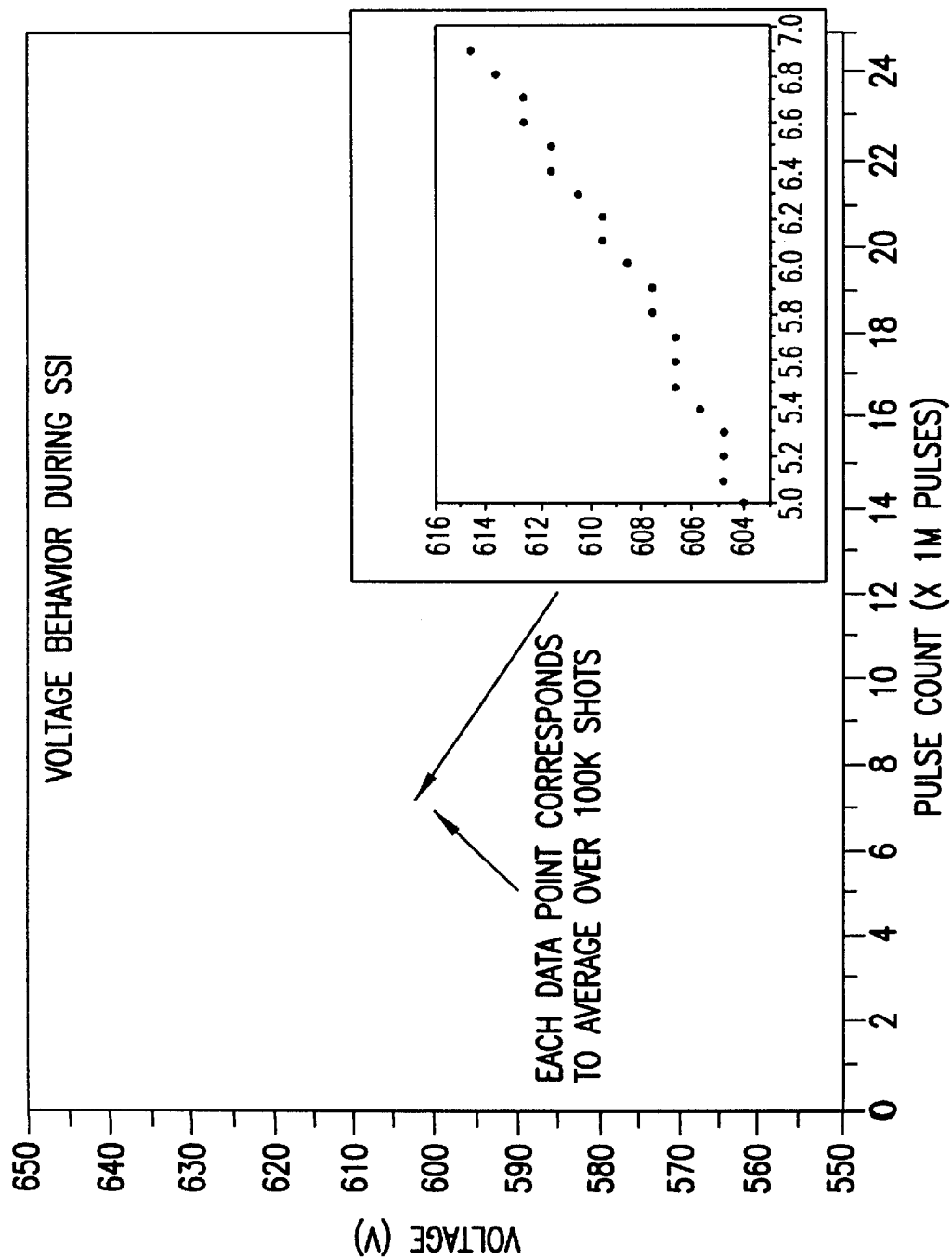
FIG. 2 is a graph showing a widely used prior art method of fluorine concentration control.

The first preferred embodiment uses the discharge voltage as a real time measure of the fluorine concentration, taking advantage of the relationship shown in FIG. 1 between discharge voltage and fluorine concentration. The fluorine concentration is actually measured periodically as a calibration check. Fluorine is injected continuously to maintain fluorine concentration substantially constant over extended time periods.

Figure 3:
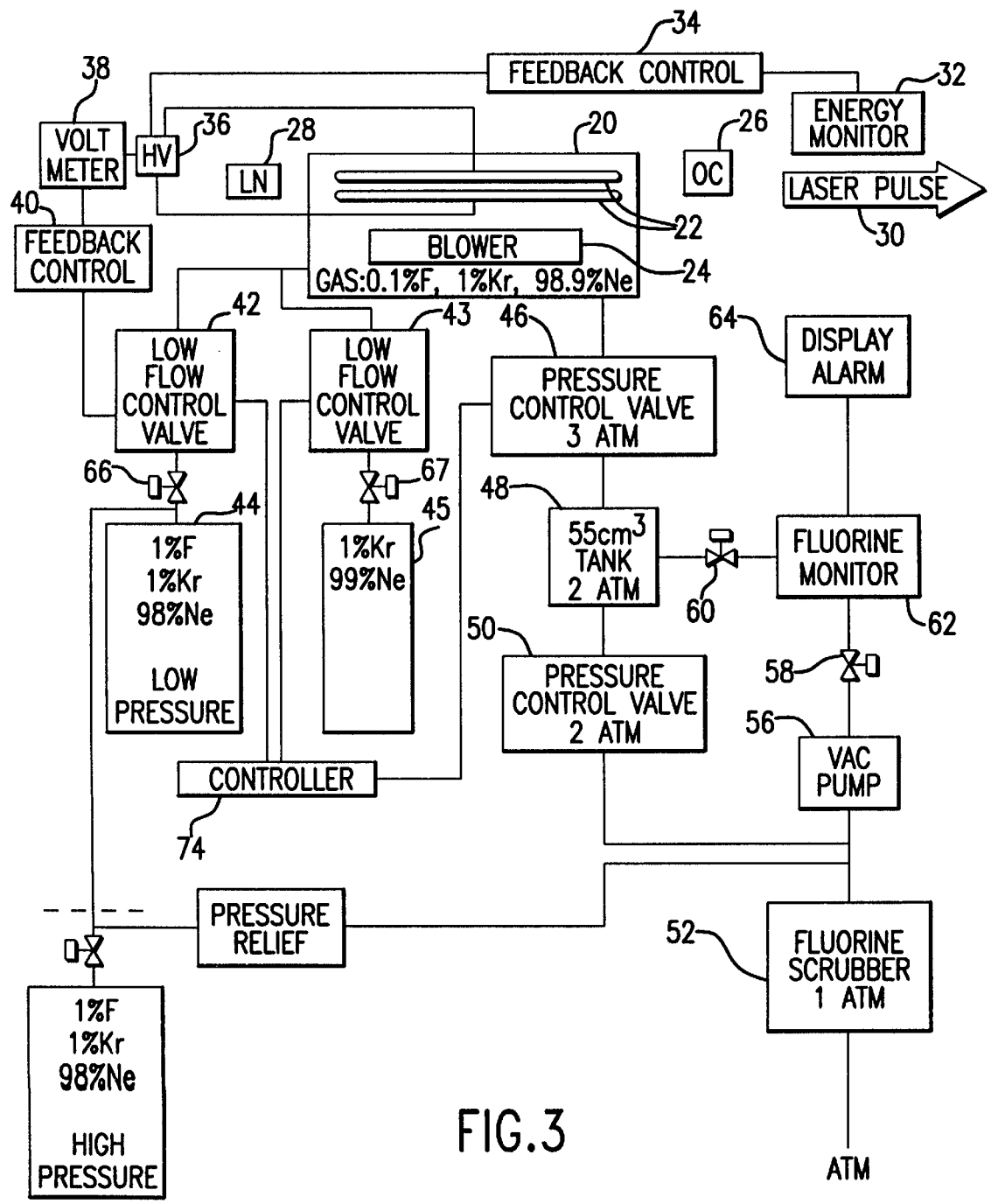
FIG. 3 is a block diagram of a first preferred embodiment of the present invention.

The principal elements of this preferred embodiment is shown in FIG. 3. A KrF excimer laser system depicted in FIG. 3 comprises conventional laser chamber 20 containing two elongated electrodes 22 and a laser gas comprised approximately of 0.1% fluorine, 1% krypton and 98.9% neon. The gas is circulated through electrodes 22 by squirrel cage blower 24 at speeds of about 1000 inches per second which permits the laser to operate in a pulse mode at rates of 1000 Hz. A resonance chamber is defined by output coupler 26 and line narrowing module 28. The energy of each laser pulse 30 is monitored by energy monitor 32. Feedback control circuit 34 controls the discharge voltage through voltage controls on charge voltage of high voltage source 36 in order to maintain the pulse energy of laser pulses 30 at desired levels notwithstanding minor variation of elements or conditions within the resonance cavity including variations in the fluorine concentration.

Voltmeter 38 monitors the charge voltage of high voltage source 36 and provides a signal to feedback control circuit 40 which provides a control signal to low flow control valve 42 in order to increase or decrease the continuous fluorine injection rate from gas bottle 44 as necessary to maintain the high voltage within a desired narrow range. The feedback control circuit 40 is programmed to reduce the flow rate to a minimal long-term, dead-time flow rate when there have been no discharges during a predetermined period such as about 3 minutes. Gas bottle 44 contains a gas made up of about 1% fluorine, 1% krypton and 98% neon. The effect of such control of the fluorine injection flow is to maintain the fluorine concentration essentially constant over time periods of several days or weeks. Over longer periods due to general deterioration of the laser gas and other laser components either the fluorine concentration or the discharge voltage or both must increase in order to maintain constant energy laser pulses. In this embodiment, the fluorine concentration is measured by fluorine monitor 62 at intervals of about 8 hours. Pressure regulator 46 maintains the pressure in chamber 20 at 3 atmospheres by releasing gas into fluorine monitor tank 48 which in turn is maintained at 2 atmospheres by pressure regulator 50. The output of pressure regulator 50 goes to fluorine scrubber 52 and the scrubbed gas is released into the atmosphere. About once per shift (about 8 hour intervals) fluorine by opening valve 60. Fluorine monitor 62 then measures the fluorine concentration in the gas contained in fluorine monitor tank 48. The fluorine concentration is displayed on display panel 64 which contains an alarm function which operates if the concentration is above a set point set by the laser operator.

The output of fluorine monitor 62 is used to calibrate voltmeter 38 to provide direct indication of fluorine concentration. Voltmeter 38 will provide this indication only when the laser is operating. Therefore, when the laser is not in use, it may be desirable to periodically (such as once per 20 minutes) to fire the laser for a few pulses in order to provide a subtantially continuous real time indication of fluorine concentration for the fluorine injection flow control so that the fluorine concentration in the chamber can be maintained at desired concentrations during dead times.

If the laser is scheduled for a down time of more than a few hours, gas bottles 44 may be isolated by closing valve 66. In this case, when operation is resumed valve 66 is opened and sufficient gas is injected into chamber 20 from gas bottle 44 and, if necessary, bottle 45 to establish the fluorine concentration at the desired level. A few test pulses may be produced to check the discharge voltage level for an indication of proper fluorine concentration. Also, two or three fluorine discharge samples could be taken and monitored by monitor 62 for a calibration check. The operator determines based on the data when the fluorine concentration is within an appropriate range to permit operation to resume. Alternatively, the laser controls could be programmed to make this determination automatically and when the laser is ready produce a "laser ready signal".

Most of the equipment depicted in FIG. 3 is prior art excimer laser equipment including energy monitor 32 and feedback control circuit 34. Feedback control circuit 40, low flow control valve 42 and 43, and pressure control valves 46 and 50 are new. Valve 42 must be fluorine compatible and should be capable of providing continuous flows at any called for flow rate (from less than 1 sccm to 30 sccm) from a 80 psig source 44 into 3-atmosphere laser chamber 20. A good choice for such a valve is Unit Instruments Model 1661 mass flow controller available from Unit Instruments, Inc. with offices in Yorba Lindsa, Calif. Their controller is capable under these conditions of providing control gas flows within the required range. This range is sufficient for typical KrF and ArF lasers over their operating lifetime. The typical fluorine injection rate during down times (no discharge) ranges from about 1 sccm with no gas circulation to about 2 sccm with gas circulation. At 1,000 Hz continuous operation, the injection rate would typically be within a range of about 8 sccm to about 12 sccm. Actual fluorine depletion rates also vary somewhat from laser to laser and as a function of laser chamber life. Generally, fluorine depletion rates increase with increasing chamber life. The Model 1661 mass flow controller contains a flow indicator so that the laser operator may monitor injection rates and take appropriate action if the injection rates are different from expected depletion rates for fluorine.

Gas fluorine monitor 62 in this embodiment is a commercially available fluorine monitor system, Model CFA 100 available from Central Engineering Company, Inc. with offices in Yamaguchi, Japan.

Second Preferred Embodiment

Figure 4:
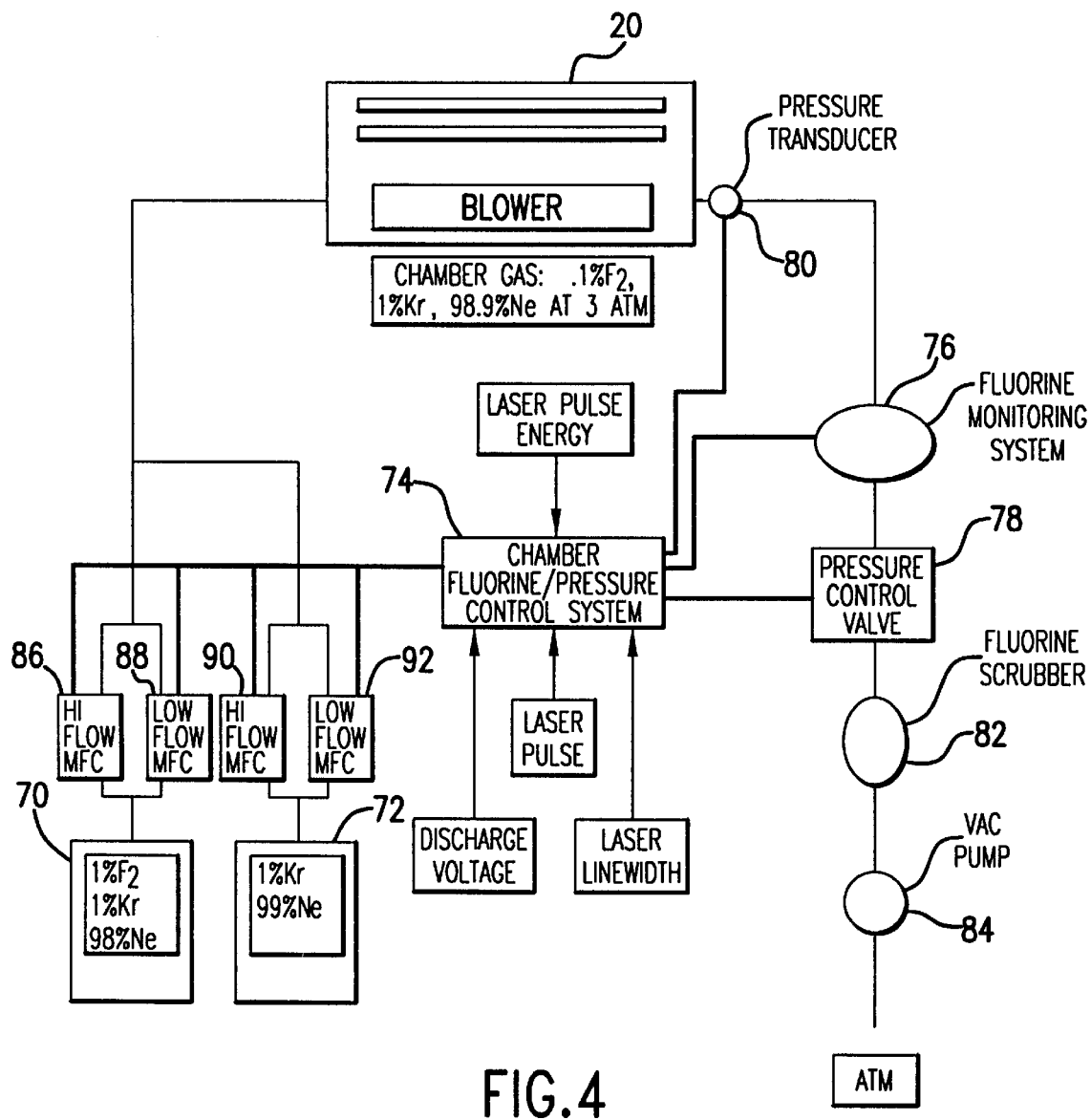
FIG. 4 is a block diagram of a second preferred embodiment of the present invention.

A second preferred embodiment of the present invention can be described by reference to FIG. 4. This system includes:

(1) chamber 20
(2) two replaceable laser gas supply cylinders, a F-Kr-Ne cylinder 70 containing a mixture of 1% F, 1% Kr and 98% Ne, and a Kr-Ne cylinder 72 containing a mixture of 1% Kr and 99% Ne
(3) a chamber fluorine/pressure control system 74
(4) a fluorine monitor 76
(5) a pressure control valve 78
(6) a pressure transducer 80
(7) a fluorine scrubber 82
(8) a vacuum pump 84
(9) high and low flow mass flow controller 86 and 88 for controlling flow from the F-Kr-Ne cylinder and high and low flow mass flow controllers 90 and 92 for controlling the flow from the Kr-Ne cylinder.

The initial fill of the chamber is directed by control system 74 through high flow controllers 90 and 86. After the chamber is filled to a pressure set point of about 3 atmosphere as detected by transducer 80. The controller switches the flow through the low flow mass flow controllers 88 and 92. As the pressure exceeds 3 atmospheres, controller 74 causes pressure control valve 78 to bleed down the chamber through fluorine monitor 76 so as to measure the fluorine concentration. If the fluorine concentration needs to be adjusted, the control system will do so by adjusting flows through controllers 88, 92 and 78 until the fluorine concentration in the chamber is the desired concentration of about 1,000 parts per million.

After the chamber is filled to the desired concentration, the fluorine concentration is monitored continuously or substantially continuously by monitor 76 and the results are fed to control system 74 which regulates flow controllers 88, 92 and 78 to maintain the concentrations of $F_2$, Kr and Ne at the desired levels and to maintain the total gas pressure at a desired value or at desired values. During downtimes input and discharge gas flows and monitoring are slowed down by control system 74 based on expected lower fluorine depletion.

Preferred mass flow controllers are available from suppliers such as Unit Instruments, Inc. with offices in Yorba Linda, Calif. Their Model 1661 is suitable for the low flow controllers and their Model 3161 is suitable for the high flow controllers. Pressure control is preferably provided in a pressure flow control module such as a Type 250B control module supplied by MKS Instruments having offices in Andover, Massachusetts. An $F_2$ monitor suitable for this embodiment is Model CFA-300 C provided by Central Engineering Co., Inc. with offices in Ube City, Yamaguchi Perfecture 755, Japan. This monitor measures fluorine using a chemical reaction in which oxygen is released and measured and it is substantially a real time monitor. U.S. Pat. No. 5,017,499 (incorporated herein by reference) describes said process. Therefore, the output of this monitor can be used as in a feedback control system to control injection from sources 70 and 72. Alternatively, it may be preferable to utilize another indicator as the real time monitor of fluorine concentration and to use the Model CFA-300 C $F_2$ monitor to periodically measure the fluorine concentration and to calibrate the real time monitor. As in the first embodiment, the discharge voltage at known pulse energies can be used as the real time measure of fluorine concentration.

The mass flow controllers can be calibrated by monitoring the rate of rise of the pressure in the chamber during refills. This operation could be performed manually by the operator or the system could be programmed to perform this calibration automatically and periodically.

Other Fluorine Monitors

Many techniques can be used for monitoring the fluorine concentration. For example, the operating current of a prior art voltage electrostatic precipitator is a function of the fluorine concentration. Other detectors arranged to measure the electrical impedance of the laser gas is indicative of the fluorine concentration. The thermal conductivity of the laser gas can be measured as an indication of fluorine concentration. Fluorine concentration can also be determined by optical absorption techniques, optical emission techniques and photo acoustic techniques. Electrochemical cells can also be used to monitor fluorine concentration. These cells are currently commercially available for measuring fluorine concentration at trace levels.

Precise monitoring and gas recycling feedback control of fluorine concentration has an additional advantage of making easier laser gas recycling. Preferably the fluorine on the discharge gas would be removed first in a fluorine trap. Then the impurities would be removed in a noble gas filter. Noble gas filters are available which would permit krypton and neon to be separated from impurities in the discharge gas while maintaining approximately the 99 to 1, neon-krypton ratio. Krypton and neon can also be separated using cryogenic separation techniques. This recycled nobel gas mixture may be injected back into the chamber or it could be mixed with a fluorine-neon-krypton mixture and then injected back into the chamber. Also, fluorine itself could be extracted from the fluorine trap and injected back into the chamber such recycling can be justified considering all relevant factors such as cost of fluorine, safety concerns, environmental concerns, etc.

While the invention has been described in detail herein in accord with certain preferred embodiments thereof, many modifications and changes therein may be effected by those skilled in the art. Persons skilled in the art well recognize that the principals discussed above with respect to KrF excimer lasers will apply equally well to ArF excimer lasers. Persons skilled in the art of excimer laser design will also recognize that the feedback control system could be used to purposely vary the fluorine concentration on a substantially real time basis either for the purpose of producing a laser beam having a time variation or for the purpose of maintaining the beam parameters constant in which case the fluorine variation would be chosen to compensate for some effect which would otherwise have produced a time variation in the beam output. Accordingly, it is intended by the appended claims to cover all such modifications and changes as fall within the true spirit and scope of the invention.

What is claimed is:

1. An excimer laser system comprising:
    A) a laser chamber containing:
        1) two spaced apart elongated electrodes;
        2) a laser gas comprising:
            a noble gas,
            fluorine,
            a buffer gas;
    B) a blower for flowing the laser gas between the two spaced apart electrodes;
    C) a real time or substantially real time fluorine monitor;
    D) a fluorine detector for calibrating said real time or substantially real time fluorine monitor;
    E) a fluorine source;
    F) a low-flow fluorine control valve; and
    G) a feedback fluorine control system arranged to control fluorine injection flow, at continuous or substantially continuous flow rates, from said fluorine source through said low-flow fluorine control valve based on feedback signals from said real time or substantially real time fluorine monitor in order to maintain fluorine concentration in said chamber substantially at a predetermined desired level.

2. An excimer laser as in claim 1 wherein said real time or substantially real time fluorine monitor comprises an electronic meter providing an electric signal indicative of the discharge voltage between the two spaced apart electrodes during laser operation.

3. An excimer laser as in claim 2 wherein said real time or substantially real time fluorine monitor comprises an electrical resistance monitor for monitoring the electrical impedance of said laser gas.

4. An excimer laser as in claim 1 wherein said excimer laser further comprises an electrostatic precipitator and said real time or substantially real time fluorine monitor comprises an electronic meter providing an electrical signal indicating the electrical impedance of gas flowing through said precipitator.

5. An excimer laser as in claim 1 wherein said fluorine detector comprises a detector gas source in which fluorine in said laser gas reacts with said detector gas source to release a detector gas which is measured to infer fluorine concentration in said laser gas.

6. An excimer laser as in claim 5 wherein said detector gas source is chosen from a group consisting of one or more hydroxides, oxides, carbonate salts, bicarbonates, sulfates, and nitrates.

7. An excimer laser as in claim 5 wherein said detector gas is oxygen.

8. An excimer laser as in claim 5 wherein said detector gas is carbon dioxide.

9. An excimer laser as in claim 1 wherein said low flow control valve and said feedback fluorine control system comprises a low flow mass flow controller.

10. An excimer laser as in claim 1 wherein the noble gas is krypton.

11. An excimer laser as in claim 10 wherein krypton comprises about 1 percent of the laser gas, fluorine comprises about 0.1 percent of the laser gas and the buffer gas is neon which comprises about 98.9 percent of the laser gas.

12. An excimer laser as in claim 1 wherein the noble gas is argon.

13. An excimer laser system comprising:
    A) a laser chamber containing:
        1) two spaced apart elongated electrodes;
        2) a laser gas comprising:
            a noble gas,
            fluorine,
            a buffer gas;
    B) a blower for flowing the laser gas between the two spaced apart electrodes;
    C) a real time or substantially real time fluorine monitor;
    D) a fluorine detector for calibrating said real time or substantially real time fluorine monitor;
    E) a fluorine source;
    F) a low-flow fluorine control valve; and
    G) a feedback fluorine control system arranged to control fluorine injection flow, at continuous or substantially continuous flow rates from said fluorine source through said low-flow fluorine control valve based on feedback signals from said real time or substantially real time fluorine monitor in order to provide fluorine concentration within the chamber at desired varying levels.

14. A process for controlling fluorine concentration in an excimer laser gas, comprised of at least two noble gases and fluorine, contained in a laser chamber comprising the steps of:
    A) monitoring, with a real time or substantially real time fluorine monitor, the fluorine concentration on a real time or substantially real time basis to provide a real time fluorine concentration signal;
    B) periodically calibrating said real time or substantially real time fluorine monitor with a fluorine detector;
    C) providing continuous fluorine injection flow into the laser chamber; and
    D) controlling the injection flow with a feedback control system utilizing the real time fluorine concentration signal; and
    E) discharging portions of said laser gas from the chamber in order to maintain approximately constant pressure in the chamber.

15. An excimer laser as in claim 14 wherein said substantially real time basis is at least once per five minutes during operation and at least once per hour during dead time.

16. A process as in claim 14 and further comprising the steps of separating noble gases from impurities and fluorine contained in laser gas discharged from the chamber and recycling the noble gases back into the chamber.

* * * * *